United States Patent [19]
Worley

[11] Patent Number: 6,020,614
[45] Date of Patent: Feb. 1, 2000

[54] METHOD OF REDUCING SUBSTRATE NOISE COUPLING IN MIXED SIGNAL INTEGRATED CIRCUITS

[76] Inventor: Eugene Robert Worley, 11 Bowditch, Irvine, Calif. 92620

[21] Appl. No.: 09/047,651

[22] Filed: Mar. 25, 1998

[51] Int. Cl.[7] .......................... H01L 27/01; H01L 27/12; H01L 31/0392; H01L 29/76; H01L 23/58

[52] U.S. Cl. .......................... 257/349; 257/500; 257/501

[58] Field of Search .................................. 257/369, 371, 257/500, 501, 506, 370, 378, 349

[56] References Cited

U.S. PATENT DOCUMENTS

| | | | |
|---|---|---|---|
| 5,045,912 | 9/1991 | Ohki | 257/371 |
| 5,373,476 | 12/1994 | Jeon | 365/226 |
| 5,376,816 | 12/1994 | Nishigoori et al. | 257/371 |
| 5,397,734 | 3/1995 | Iguchi et al. | 437/70 |
| 5,501,993 | 3/1996 | Borland | 437/34 |
| 5,726,477 | 3/1998 | Williams et al. | 257/402 |
| 5,856,695 | 1/1999 | Ito | 257/370 |

OTHER PUBLICATIONS

John Borland and Ron Koelsch, "MeV Implantation Technology: Next–Generation Manufacturing With Current–Generation Equipment", Solid–State Technology, p. 28, Dec., 1993.

*Primary Examiner*—Mahshid Saadat
*Assistant Examiner*—Jesse G. Fenty

[57] ABSTRACT

A low cost means is described to semi-isolate the substrate regions of an integrated circuit occupied by a plurality of circuit types with separate power supply connections but with interconnecting signals. The separate power supply connections are made to minimize noise generated by one circuit from coupling into another circuit. One example of integrated circuits with a noise coupling issue are the so called "mixed signal" circuits in which the switching transient noise of digital circuits can interfere with the performance of on board analog circuits. Because of a common substrate, noise injected into the substrate by one circuit can affect the performance of another. This invention reduces the effect of substrate noise by providing an isolation zone around a given circuit type of an integrated circuit by removing the field implant in this zone and placing a deep implant of the same polarity type as substrate in the N channel transistor regions. This implant is tied to local ground or Vss buses and is not present in the isolation zone.

4 Claims, 6 Drawing Sheets

METHOD OF REDUCING SUBSTRATE NOISE COUPLING IN MIXED SIGNAL INTEGRATED CIRCUITS

BACKGROUND OF THE INVENTION

1. Field of the Invention

This invention relates to the field of semiconductor integrated circuits, and particularly to an improvement in reducing substrate noise coupling in mixed signal circuits or circuits containing both analog and digital circuits on a common silicon substrate.

2. Description of the Related Art

So called mixed signal integrated circuits have been gaining in market share of the integrated circuit market. Typically, these integrated circuits contain both analog and digital circuits. With the low cost and high speed processing capabilities of Digital Signal Processors (DSPs) many analog applications now use on board DSPs to perform signal processing rather than analog means as was done for earlier applications. Also, the input signal of many analog applications is formatted digitally or, conversely, the output is formatted digitally. Thus, if low cost single chip solutions are to be used, both digital and analog circuits must coexist on the same substrate. A single chip containing both digital and analog circuits is often referred to as mixed signal MOS integrated circuit.

Because of the noise associated with the transient switching behavior of digital circuits, it is desirable to minimize the electrical interaction between the analog and digital circuits of mixed signal chips. This goal is partially met by completely separating the power supply wires or lines associated with each type of circuit. In fact, it is even common to isolate various analog circuit components from each other by using separate power bussing for each of these components. Unfortunately, the substrate remains common to all circuits on the chip and therefore couples noise from one circuit to another. This substrate noise can be amplified by the body to source transconductance of MOS signal transistors and thereby can be injected into analog signal paths.

The primary source of substrate noise injection is the substrate tie which is connected to a noisy ground power supply line. To lower substrate noise it is desirable to have a dedicated bus which connects to all substrate ties but does not connect to Vss or ground power. Unfortunately, most logic cell libraries do not permit the separation of the substrate tie from the Vss power line. Other substrate noise injection sources include transitioning nodes or signal lines which capacitively couple to the substrate. Capacitive noise injecting means include node to substrate capacitances such as N+/P substrate junctions and metal signal lines which are routed over the substrate.

Most commonly, CMOS integrated circuits use a P type substrate which becomes the body of the N channel MOS transistors and therefore, makes the N channel transistors susceptible to substrate noise. The P channel transistors for such cases, however, are relatively immune from substrate noise because of the isolated N well which ties to a positive power supply voltage which can be separate from other positive supply voltages.

Figure 1:
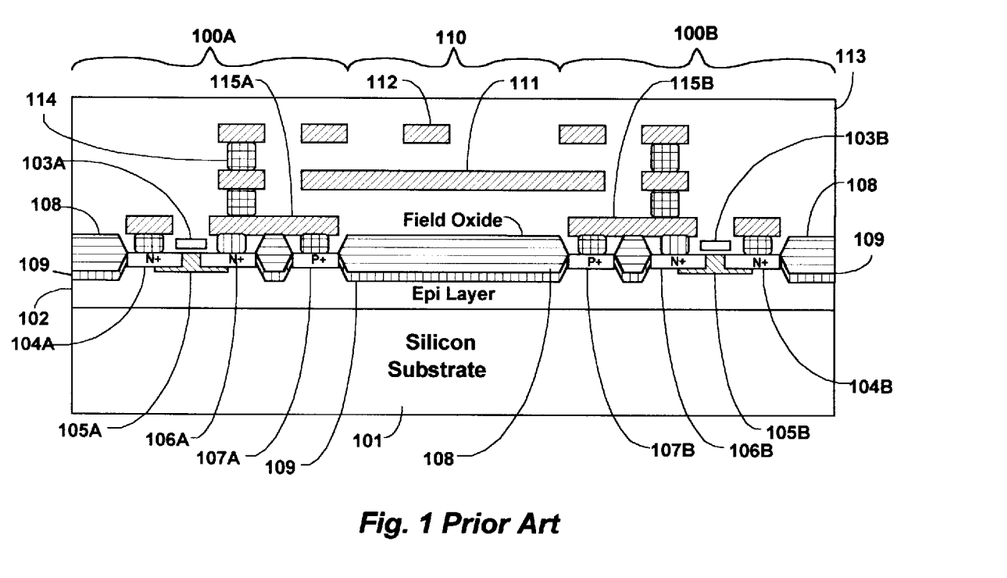
FIG. 1 shows a cross section diagram of two N channel transistors of different circuit types with different substrate tie connections separated by a semi-isolating zone.

FIG. 1 shows a cross section of two N channel transistors, 100A and 100B, connected to different power buses in a standard, epitaxial CMOS process with a P type substrate 101. The epi layer 102 is also P type. Other structures found in this cross section include the poly silicon gate 103A of transistor 100A, the poly silicon gate 103B of transistor 100B, the drain N+ implant 104A of transistor 100A, the drain N+ implant 104B of transistor 100B, the channel doping or implant 105A of transistor 100A, the channel doping or implant 105B of transistor 100B, the source N+ implant 106A of transistor 100A, the source N+ implant 106B of transistor 100B, the P+ substrate tie 107A associated with transistor 100A, the P+ substrate tie 107B associated with transistor 100B, the field oxide region 108, the field implant regions 109, examples of metal interconnect 111 and 112, interlevel dielectric material 113, and interconnect plugs 114 used to connect one level of metal with another.

For the sake of illustration, assume that the N channel transistor 100A is on the digital side and the N channel transistor 100B is on the analog side on a single chip or integrated circuit die. A field oxide gap region 110 is typically used to used to "isolate" the substrate/epitaxial areas of the two different functional regions. In this example it is desired that the analog Vss bus 115B hold the potential of the body region 105B of transistor 100B to a constant, noiseless potential through substrate tie 107B. However, some noise from the digital Vss bus 115A will couple over to the body region 105B via the digital body tie 107A, the epitaxial layer 102, and the heavily doped substrate 101. In examples to be shown later, the ability of substrate tie 107B is very limited in providing noise isolation from the digital Vss bus 115A.

It should be noted that a bulk wafer can also be used in lieu of an epitaxial wafer. In advanced CMOS processes bulk wafers with a heavy substrate doping have been used successfully with generous spacing I/O pad layout rules used to prevent latch-up due to parasitic SCR structures.

Figure 2:
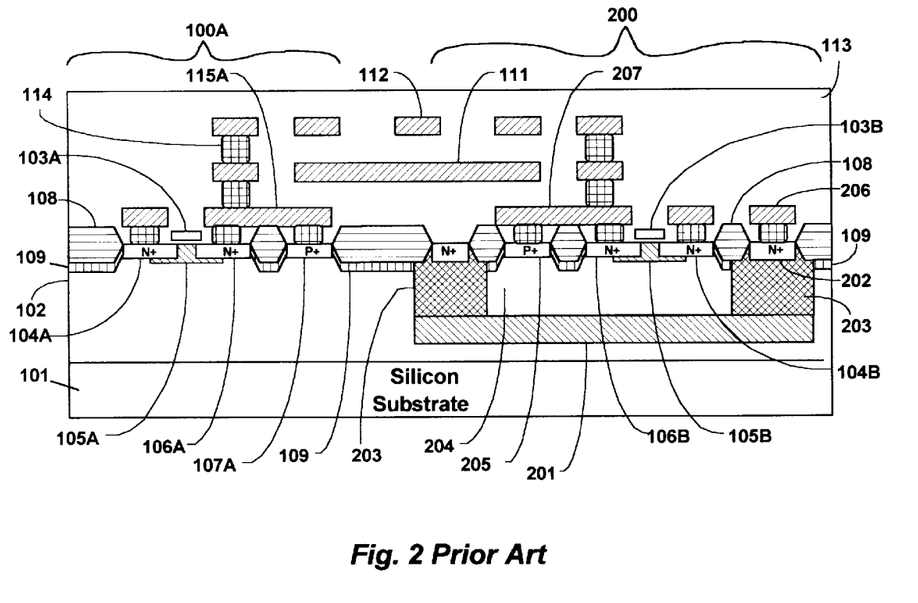
FIG. 2 shows a cross section diagram of two N channel transistors of different circuit types in which the body of right hand transistor is isolated from the substrate by using the junctions formed from N type implants.

One method to significantly reduce such noise is to use to used the so called triple well process. A cross section of two N channel transistors, 100A and 200 are shown in FIG. 2. The N channel transistor 200 has a P type well 204 which is isolated from the epitaxy and the substrate by using an intervening N type layer 201 which is formed using a deep, high energy implant. The isolated P well 204 is connected to Vss 207 via a P+ implant which is the same as that used to form the P+ drain/source implants of the P channel transistor which is not shown. Note that the Vss 207 of transistor 200 is separate from the Vss 115A associated with the left hand N channel transistor 100A. The side walls of the isolated P well 204 are bounded by a vertical implanted N well 203 which extends from the surface of the silicon to the deep N layer 201. To electrically contact the N type regions enclosing the isolated P well 204 there are N+ implant 202 regions at the surface which are formed along with the N channel transistor's drain 104B and source 106B implants. If the N well associated with the P channel transistor is deep enough then this implant can be used as the isolating sidewall implant 203; otherwise a separate implant must be used or a combination thereof. To isolate the body of the N channel transistor 200 from the epitaxial layer 102 and the substrate 101 the enclosing N layers 201 and 203 are connected to an isolated, low noise Vdd via the bus metal 206.

The excellent isolation of N channel transistor 200 from substrate/epitaxy noise voltage comes at a price. At least two implants and implant masking steps must be added to the process: the deep N implant layer 201 and the isolated P well 204. Also, as mentioned earlier, if the N well implant associated with the P channel transistor is not deep enough for use as the sidewall N implant 203 then a third implant and masking layer must also be added to the process. Another problem is that the additional chip area must be used to make frequent deep N layer 201 contacts and frequent isolated P well ties 205. The triple well structure introduces a vertical PNPN device or vertical parasitic SCR which can easily latch up if frequent deep N layer 201 ties and isolated P well ties to the power supply rails are not used. Note also that Vdd busing is required to bias the deep N layer 201 in addition to Vss busing for the isolated P well tie 205. The reduction in layout area efficiency required for the isolating the N channel transistor's body is unacceptable for digital circuits where high substrate noise can be tolerated. For this reason, the "digital" N channel transistor 100A of FIG. 2 is shown with a conventional body connection to the epitaxy 102/substrate 101. Thus, for the analog portion of a mixed signal chip N channel transistors with isolated bodies can be considered if good N channel transistor isolation is required and the chip is not cost sensitive.

SUMMARY OF THE INVENTION

According to the present invention, there is provided a semiconductor integrated circuit comprising a single semiconductor substrate, boundary zones between two or more separate circuits which have separate sets of power supply buses. Interconnect signal lines or wires between the various isolated circuits are also provided so that any one circuit may functionally interact with other circuits while the substrate noise coupling from the other circuits to that one said circuit is low.

It is an object of the invention to provide low substrate noise coupling between circuits of different, isolated power supplies using low cost methods with said circuits residing on the same integrated circuit substrate.

In accordance with the present invention, the low substrate noise coupling is achieved by using isolation zones between the plurality of circuits on a single chip fed by different, isolated power supplies. The isolation zone includes a region in which the field implant layer is not applied thereby eliminating a conductive silicon surface path between the various circuits of different, isolated power supplies. Also, a deep P type implant is applied in lieu of an epitaxial layer to provide robust body connections to N channel transistors. This conductive implanted layer is removed in the isolation zone to further lower substrate noise coupling between circuits of different, isolated power supplies. Finally, because of the substantial conductivity of the deep implant layer a lightly doped bulk substrate is used to further lower substrate noise coupling between circuits of different, isolated power supplies.

PRIOR ART STATEMENT

U.S. Pat. No. 5,397,734. *Method of Fabrication a Semiconductor Device Having a Triple Well Structure.* This patent describes a triple well structure for isolating DRAM cells from the noise generated by peripheral circuits.

U.S. Pat. No. 5,373,476. *Highly integrated Semiconductor Memory Device with Triple Well Structure.* A triple well structure is described with improved isolation properties.

U.S. Pat. No. 5,501,993. Method of Constructing CMOS Vertically Modulated Wells by Clustered MEV BILLI (Buried Implanted Layer for Lateral Isolation) Implantation. This patent describes the formation of triple well structures using MEV implanters.

John Ogawa Borland and Ron Koelsch, "MeV Implantation Technology: Next-Generation Manufacturing with Current-Generation Equipment", *Solid State Technology*, p. 28, December, 1993. This paper describes triple well structures used in IC technology.

DETAILED DESCRIPTION OF THE PREFERRED EMBODIMENTS

Figure 3:
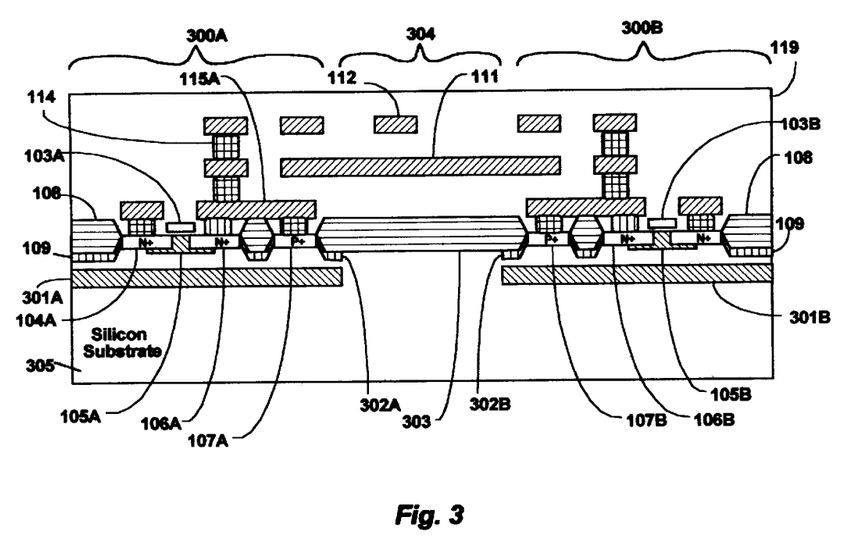
FIG. 3 shows a cross section diagram of two N channel transistors of different circuit types in which the field implant has been removed from the semi-isolating zone and deep, high energy implants are located under the transistors but not in the semi-isolating zone.

FIG. 3 shows a cross section of the preferred embodiment. It is similar to FIG. 1 except for some important changes. One is that the field implant has been removed in the field oxide isolation zone 304 which forms the boundary between circuit types and corresponds to 110 of FIG. 1. Note the at the ends of the isolation zone or gap region 304 there are field implants 302A and 302B which form channel stops for any conducting line which crosses over the isolation zone region 304 such as metal line 111. The removal of the field implant at the isolation zone 304 lowers the conductivity between circuit elements which ideally should be isolated from each other. In the case illustrated in FIG. 3 this would be the body nodes of N channel transistors 300A and 300B.

Another change is that a bulk wafer 305 is used with a deep, high energy P+ implant 301A and 301B which is used to provide a low resistance substrate shunt path for the bodies of the N channel transistors. Note that this implant 301A and 301B is placed under N channel transistors but not in the isolation zone 304. This implant therefore proves a low impedance path between substrates ties and the body regions of nearby N channel transistors such as the tie 107A and its nearby N channel transistor 300A or the tie 107B and its nearby N channel transistor 300B. Since the deep P+ implant 301A and 301B is absent in the isolation zone the conductive path between the N channel transistor bodies of one circuit type to the N channel transistor bodies of a second type is thus lowered. Since this implant is effective at shunting body currents to the substrate ties (107) the substrate 305 doping concentration can be lowered thereby providing more isolation between circuit types.

The implementation of the field implant break across the isolation zone 304 requires no additional masking or processing steps. A marking layer over the isolation zone 304 can be added to the normal field implant mask layer.

The deep P implant layer 301A and 301B does, however, require an additional masking step and implant. The cost of this processing step is relatively low, however, especially if it can be used to eliminate the use of an epitaxial wafer in favor of a bulk wafer.

Two dimensional resistance simulations were performed to determine the reduction in substrate noise coupling between N channel transistors of different circuit types using a combination of the methods described above. A number of simplifying assumptions were made.

One assumption was that the doping concentration within an implant layer is constant. This assumption introduces little error since the thickness of an implant layer is in the neighborhood of 1 μm whereas the lateral extent or X dimension used in the simulation varied from 50 to 100 μm. Thus, an implant was quantitatively described as having a resistivity, a depth, and a width. Another assumption was that the surface is planar. Since surface topology variation introduced by field oxidation is small compared with the lateral extent of the simulation little error is introduced. Also, the channel implant was assumed to be the same as the field implant. Since the channel doping exists over short segments in the lateral direction relative to the lateral extent of the simulation this assumption also introduces a small error. Finally, the N+ implants which are shallow were neglected.

Figure 4:
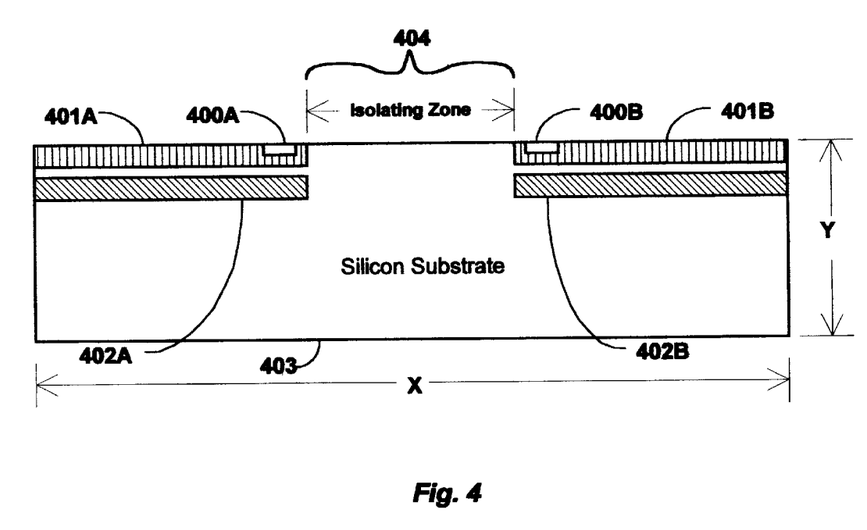
FIG. 4 shows an electrically simplified cross section of the structure of FIG. 3 which was used in two dimensional resistance analysis.

FIG. 4 shows a cross sectional diagram of the regions used in the simulation. The depth of the simulation into the substrate 403 or Y dimension was half that of the X dimension. The P+ ties are represented by 400A and 400B, the field/channel implant by 401A and 401B, and the deep P+ implants by 402A and 402B. In this figure a gap 404 in the implants 402A and 402B is shown which represents the isolation space between two circuits of different, isolated power supplies. At the boundaries of the silicon it was assumed that the current flow is zero. At the right and left hand boundaries this condition mathematically mirrors the deep implants 402A and 402B, the P+ diffusions 400A and 400B, and the field/channel implants 401A and 401B beyond the boundaries. The zero current boundary condition at the bottom of the silicon substrate should have little impact on the result since the current that would otherwise cross this boundary is small.

The P+ substrate tie voltage feed through from side A to side B was simulated by placing one volt on the P+ tie 400A and grounding P+ tie 400B and then monitoring the voltage near the surface of the silicon on the B side. For the case represented in FIG. 4 the maximum voltage near the surface on the B side occurred at the extreme right. Thus, if the body of an N channel transistor were to exist there it would experience the greatest amount of noise coupling from the P+ tie 400A. Because of the mirror effect, this location is equivalent to being positioned equidistant from two B side grounding P+ substrate ties.

Table I below summaries the simulation results. The substrate type and resistivity were varied. In Item 1, for example, the simulation was made using a 20 Ω-cm epi layer with a thickness of 5 μm and a substrate resistivity of 0.01 Ω-cm. For bulk substrate simulations a resistivity of 12 Ω-cm was chosen which is typical for processes where the channel lengths are above 0.5 μm. For the simulations which had the deep implant both a 12 Ω-cm and a 20 Ω-cm substrate used. With a deep P+ implant a lighter doped substrate such as 20 Ω-cm can be used because of the good current shunting ability of this layer.

TABLE I

| Item No | Sub Ro (Ω-cm) | Fld Imp Gap | Deep Imp Ro | Zone Width | Atten Factor | R (KΩμm) |
|---|---|---|---|---|---|---|
| 1 | 20/EPI | No | None | 14 μm | 0.1887 | 33.1 |
| 2 | 12 | No | " | " | 0.0685 | 39.3 |
| 3 | " | Yes | " | " | 0.0601 | 175.7 |
| 4 | " | Yes | 0.1 Ω-cm | " | 0.0203 | 149.7 |
| 5 | 20 | Yes | 0.1 Ω-cm | " | 0.0124 | 246.8 |
| 6 | 20 | No | 0.1 Ω-cm | " | 0.0326 | 40.7 |
| 7 | 20/EPI | No | None | 12 μm | 0.2050 | 30.17 |
| 8 | 12 | No | " | " | 0.0762 | 34.98 |
| 9 | " | Yes | " | " | 0.0665 | 163.0 |
| 10 | " | Yes | 0.1 Ω-cm | " | 0.0225 | 137.7 |
| 11 | 20 | Yes | 0.1 Ω-cm | " | 0.0138 | 225.9 |
| 12 | 20 | No | 0.1 Ω-cm | " | 0.0369 | 35.86 |
| 13 | 20/EPI | No | — | 12 μm | 0.0421 | 39.0 |
| 14 | 12 | No | — | " | 0.0158 | 51.7 |
| 15 | " | Yes | — | " | 0.0130 | 207.2 |
| 16 | " | Yes | 0.1 Ω-cm | " | 0.00614 | 184.4 |
| 17 | 20 Ω-cm | Yes | 0.1 Ω-cm | " | 0.00322 | 305.0 |

The column labeled "Fld Imp Gap" refers to whether or not the field implant is present in the isolation zone 404 shown in FIG. 4. The column labeled "Deep Imp Ro" refers to the resistivity of the deep P+ implant layer 402A and 402B of FIG. 4. If present, the width of this layer was assumed to be 1.5 μm. The column labeled "Zone Width" refers to the width of the isolation zone 404 of FIG. 4. The column labeled "Attn Factor" refers to the voltage attenuation factor at a point located at the far right boundary of the silicon, 0.5 μm below the top surface of the silicon. The attenuation factor is defined as the voltage appearing at this point with one volt applied at the P+ substrate tie 400A and 0 volt applied to tie 400B. The voltage applied to tie 400A is assumed to be that associated with a noisy Vss source while tie 400B is that of a different, quiet Vss source or a separate, analog substrate tie source. Finally, the column labeled "R" refers to the resistance between tie 400A and 400B in KΩ-μm.

As shown in Table I the worst case attenuation factor is for the case in which 20 Ω-cm epi is used. Item 7 shows that for a 12 μm isolation zone width and no suppression of the field implant in the zone 404 the coupling coefficient is 0.205 and the resistance between tie 400A and 400B is 30.17 KΩ-μm. Going to a bulk substrate with a resistivity of 12 Ω-cm as seen in item 8 lowers the attenuation factor to 0.0665 and increases the resistance to 35 KΩ-μm. However, removing the field implant in the zone 404 (item 9) lowers the attenuation by a relatively small amount but increases the resistance between ties substantially; i.e. from 35 to 163 KΩ-μm. Finally, by using a light substrate resistivity (20 Ω-cm), a deep +P implant 402A and 402B, and a suppressed field implant in the zone 404 the attenuation factor is reduced to 0.0138 and the resistance increased to 226 KΩ-μm as shown in item 11. Thus, the present invention improves the substrate attenuation factor by a factor of nearly 15 over a conventional epi process and by a factor of 5.5 for a bulk process using a 12 Ω-cm substrate. The present invention increases the tie 400A to tie 400B resistance by a factor of 7.5 over the epi process and by a factor of nearly 6.5 over the bulk process. Various other examples can also be found in Table I.

It should be noted that the tie 400A to tie 400B resistance should be as large as possible so that large currents do not flow from one isolated Vss line to another isolated Vss line. Large currents flowing from one tie 400A into the other tie 400B can cause voltage drops in the Vss bus connected to tie 400B which constitutes undesirable noise in this power bus.

Figure 5:
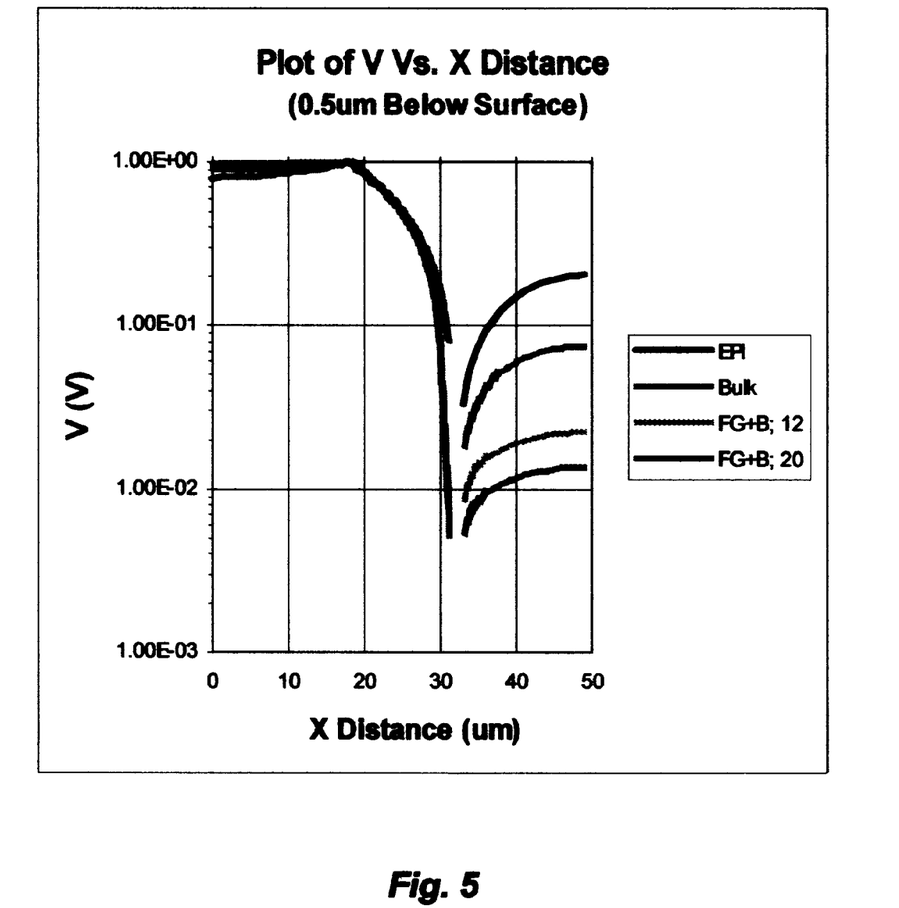
FIG. 5 shows a plot of the voltage 0.5 μm below the surface of the silicon of the structure of FIG. 4 as a function of distance with one volt applied to the left hand substrate tie and 0 volt applied to the right hand substrate tie.

FIG. 5 shows a plot of the voltage 0.5 μm below the surface of the silicon of FIG. 4 versus X distance along the silicon from left to right. The "EPI" line corresponds to item 7 of Table I, the "BULK" line to item 8, the "FG+B,12" to item 10, and the "FG+B,20" to item 11. The attenuation factor values of Table I correspond to the plot values at X=50 μm in FIG. 5. Thus, if the body of a transistor where located at X=50 μm then the substrate noise injected by P+ tie 400A and shunted by P+ tie 400B would be attenuated by the amount shown in the plot as a function of X distance for the various cases.

Figure 6:
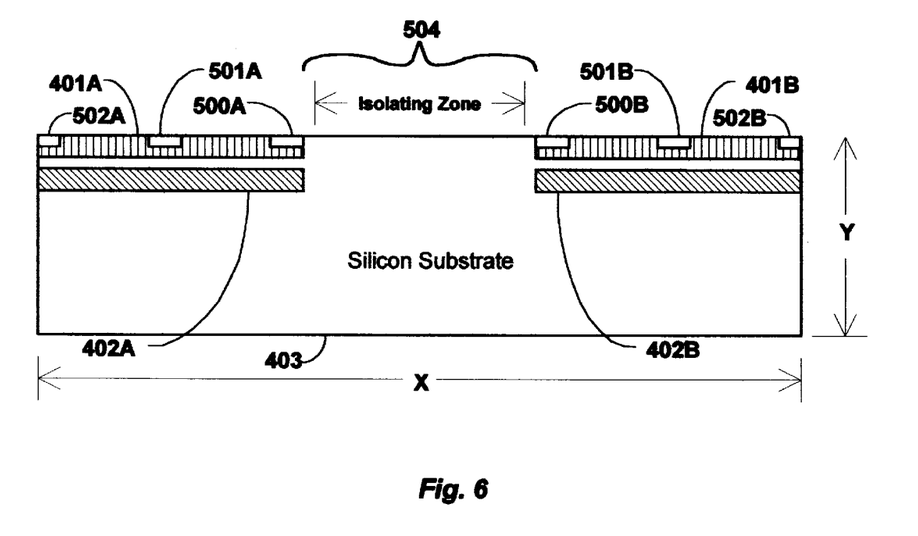
FIG. 6 shows an electrically simplified cross section similar to that of FIG. 4 except that except that 3 substrate ties are used to the right of the semi-isolating zone and 3 substrate ties to left.

Table II shows simulation results for cases in which the isolation zone width is 20 μm and there are 3 P+ substrate ties per Vss node as shown in FIG. 6. The three ties for a given Vss node are separated by 20 μm spaces in the simulation performed. One of the three ties 502A and 502B is located at the silicon boundaries, another 500A and 500B at the isolation zone 504 boundaries, and the third 501A and 501B in the middle between the two other P+ ties, 500A and 502A and 502B. As before, three sets of ties, 500A, 501A, and 502A, are attached to a one volt supply which corresponds to the noise injecting Vss bus and the other three ties, 500B, 501B, and 502B, on the other side of the isolation zone 504 are attached to a 0 V quiet bus. The intention of the simulation results reported in Table II is to examine the effectiveness of the invention in suppressing noise at substrate points further removed from the isolation zone 504 and to see the effect of substrate ties that lie beyond the ties located at the boundaries of the isolation zone 504.

For the situation described above there are two maximum attenuation factors located near the surface of the "B" side. One lies between the P+ tie 500B on the isolation zone 504 boundary and the middle P+ tie 501B and the other lies between the P+ tie 501B in the middle and the P+ tie 502B at the silicon boundary. Table II reports these two maximum attenuation factors as "Attn Factor1" and "Attn Factor2", respectively. The column labeled "R" is the net resistance between the three P+ substrate ties, 500A, 501A, 502A, on the A side to the three P+ substrate ties, 500B, 501B, 502B, on the B side.

Item 19 of Table II corresponds to the standard epi case with the field implant placed in the isolation gap region 504. Item 23 corresponds to the case where the present invention is employed; i.e. the field implant is blocked over the isolation zone 504 and deep buried P+ implants 402A and 402B are made in a lightly doped 20 Ω-cm substrate 403. The improvement in using the present invention over the conventional epi approach is a factor of 24 for the attenuation factor corresponding to the first maximum or the maximum between the P+ tie 500B near the isolation gap 504 and the mid P+ tie 502B. The improvement increases to a factor of 47.6 for the second maximum or the maximum between the mid P+ tie 502B and the P+ tie 502A at the silicon boundary. The resistance between the A and B P+ ties shows an increase by a factor of 9.2.

Item 20 corresponds to the standard bulk substrate case. The improvement in using the present invention over the conventional bulk substrate approach is a factor of 6.3 for the attenuation factor corresponding to the first maximum. The improvement is a factor of 6.4 for the second maximum. The resistance between the A and B P+ ties shows an increase by a factor of 5.4.

Figure 7:
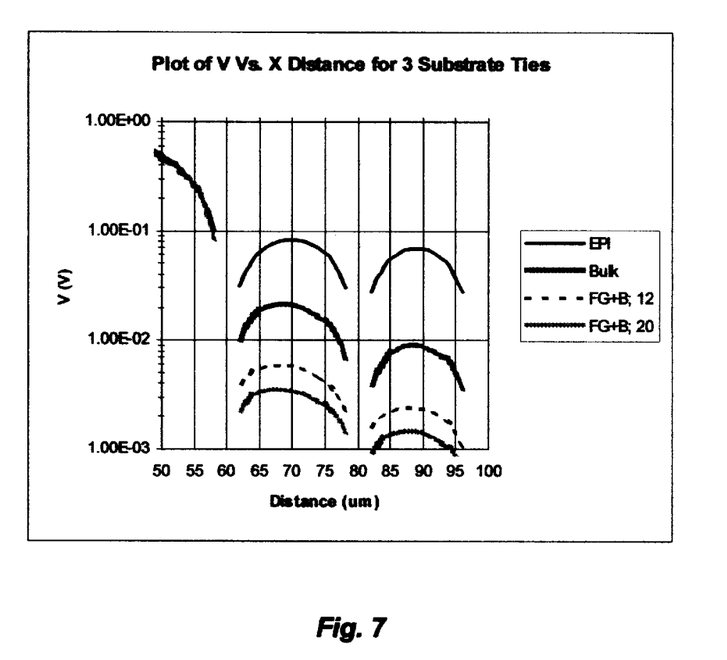
FIG. 7 shows a plot of the voltage 0.5 μm below the surface of the silicon of the structure of FIG. 6 as a function of distance with one volt applied to the 3 left hand substrate ties and 0 volt applied to the 3 right hand substrate ties.

FIG. 7 shows a plot of voltage or, because of use of a normalized voltage of 1 volt, the attenuation factor near the surface of the silicon versus "X" distance in a direction parallel to the silicon surface. The X axis starts at the isolation gap midpoint. The "EPI" line corresponds to item 19 of Table II, the "BULK" line to item 20, the "FG+B,12" to item 22, and the "FG+B,20" to item 23. The P+ implant on the B side are centered at X=60, 80, and 100 μm. The attenuation factor values of Table II correspond to the two maximums occurring between the P+ ties.

Figure 8:
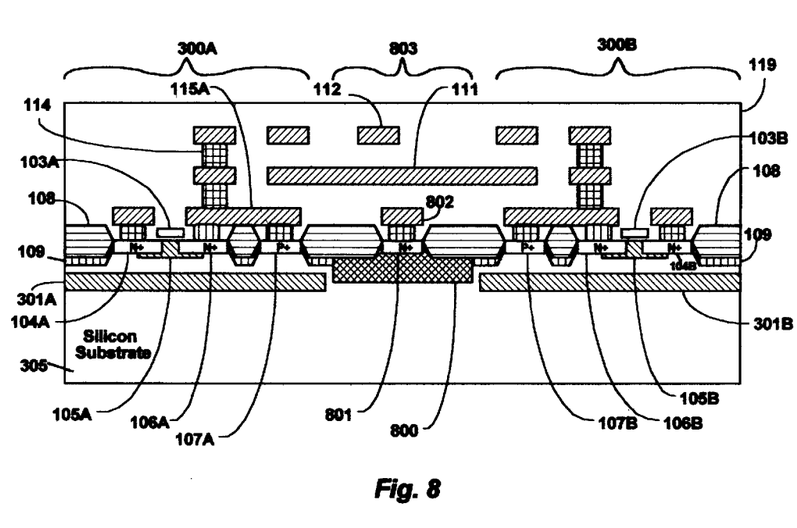
FIG. 8 shows a cross section diagram similar to that of FIG. 3 except that an N well is placed in the isolation zone.

FIG. 8 shows a version of the isolation zone 803 in which the gap in the field implant is replaced by an N well 800 which is associated with the P channel transistors. The N well blocks conduction in the part of the isolation zone 803 that is in proximity to the silicon surface. To prevent injection of carriers into the silicon substrate due to severe substrate bounce the N well is tied to a Vdd power bus via an N+ implant 801 and Vdd power metal interconnect 802. The main advantage of this approach is that injected minority carriers from one circuit will tend to be collected by the N well 800 before reaching the circuit on the other side of the isolation zone or strip. A two dimensional simulation performed on this structure using the conditions of item 23 of Table II with the exception of the N well resulted in an Attenuation Factor1 of 0.00343, an Attenuation Factor2 of 0.00141, and a P+ tie to P+ tie resistance of 261.9 KΩ-μm. This result indicates that the attenuation factor is almost unchanged as to whether the field implant gap is used or the N well is used within the isolation strip. The P+ tie to P+ tie resistance, however, is increased by 16%.

In conclusion, the present invention offers both a decrease in substrate noise coupling between different circuit types with different power buses and an increase in coupling resistance between the substrate ties of the different circuit types. Furthermore, the present invention requires only one additional masking step which adds a small cost over a bulk process and a cost savings over an epi process.

What is claimed is:
1. A semiconductor integrated circuit comprising:
   a semiconductor P type substrate;
   a plurality of circuit regions formed on said semiconductor substrate wherein each one of said circuit regions is connected to a different power supply;
   field isolation regions formed on said substrate in the plurality of circuit regions;

TABLE II

| Item No. | Sub Ro | Fld Imp Gap | Deep Imp Ro | Zone Width | Attn Factor1 | Attn Factor2 | R (KΩ-μm) |
|---|---|---|---|---|---|---|---|
| 18 | 20/EPI | Yes | — | 20 μm | 0.126 | 0.104 | 27.2 |
| 19 | 20/EPI | No | | " | 0.0829 | 0.0680 | 24.1 |
| 20 | 12 Ω-cm | No | — | " | 0.0217 | 0.00910 | 43.22 |
| 21 | " | Yes | — | " | 0.0215 | 0.00889 | 150.3 |
| 22 | " | Yes | 0.1 Ω-cm | " | 0.00590 | 0.00245 | 139.8 |
| 23 | 20 Ω-cm | Yes | 0.1 Ω-cm | " | 0.00345 | 0.00143 | 231.6 |
| 24 | " | No | 0.1 Ω-cm | " | 0.00354 | 0.00146 | 48.1 | isolation zones formed between said plurality of circuit regions and separating said plurality of circuit regions wherein a field oxide layer is formed within each one of said isolation zones;

field implant regions formed under the field isolation regions in the plurality of circuit regions wherein said field implant regions are formed outside of said isolation zones;

deep high energy P+ implant regions formed in the semiconductor substrate under said plurality of circuit regions and each one of said deep high energy P+ implant regions being connected to a power supply terminal of the particular circuit region above said P+ implant region wherein said deep high energy P+ implant regions are absent in said isolation zones.

2. The semiconductor integrated circuit of claim 1, wherein an N well connected to a positive power supply terminal is placed in {the semi-isolating} said isolation zone.

3. The semiconductor integrated circuit of claim 1, wherein the substrate is N type and the deep high energy implant is N type.

4. The integrated circuit of claim 3, wherein a P well connected to ground is placed in said isolation zone.

* * * * *